US010410705B2

(12) United States Patent
Morton et al.

(10) Patent No.: US 10,410,705 B2
(45) Date of Patent: Sep. 10, 2019

(54) SENSE PATH CIRCUITRY SUITABLE FOR MAGNETIC TUNNEL JUNCTION MEMORIES

(71) Applicant: NXP USA, INC., Austin, TX (US)

(72) Inventors: Bruce L. Morton, Austin, TX (US); Michael A. Sadd, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/673,468

(22) Filed: Aug. 10, 2017

(65) Prior Publication Data

US 2017/0337960 A1    Nov. 23, 2017

Related U.S. Application Data

(62) Division of application No. 14/924,269, filed on Oct. 27, 2015, now Pat. No. 9,773,537.

(51) Int. Cl.
*G11C 11/16* (2006.01)
*G11C 14/00* (2006.01)
*G11C 7/06* (2006.01)

(52) U.S. Cl.
CPC .......... *G11C 11/1673* (2013.01); *G11C 7/062* (2013.01); *G11C 14/0036* (2013.01); *G11C 14/0081* (2013.01)

(58) Field of Classification Search
CPC . G11C 11/1673; G11C 7/062; G11C 14/0036; G11C 14/0081
See application file for complete search history.

(56) References Cited

U.S. PATENT DOCUMENTS

| | | | |
|---|---|---|---|
| 5,717,640 A | 2/1998 | Hashimoto | |
| 6,205,073 B1 | 3/2001 | Naji | |
| 6,396,733 B1 | 5/2002 | Lu et al. | |
| 6,674,679 B1 | 1/2004 | Perner et al. | |
| 6,816,403 B1 | 11/2004 | Brennan et al. | |
| 7,038,959 B2 * | 5/2006 | Garni | G11C 7/062 365/203 |
| 7,319,606 B2 | 1/2008 | Miyamoto | |
| 7,679,405 B2 | 3/2010 | Wilson | |
| 8,363,457 B2 | 1/2013 | Keshtbod | |
| 9,378,781 B1 | 6/2016 | Jung et al. | |
| 9,390,779 B2 | 7/2016 | Jung et al. | |
| 2008/0170454 A1 | 7/2008 | Pelli et al. | |
| 2013/0286721 A1 | 10/2013 | Jung et al. | |
| 2014/0056059 A1 | 2/2014 | Mueller et al. | |

(Continued)

OTHER PUBLICATIONS

Andre et al, "ST-MRAM Fundamentals, Challenges, and Applications", IEEE Custom Integrated Circuits Conference (CICC), Sep. 22-25, 2013, pp. 1-8.

(Continued)

*Primary Examiner* — Anthan Tran

(57) ABSTRACT

A memory includes a first memory cell; and a second memory cell. A selectable current path is coupled between the first memory cell and the second memory cell. The selectable current path includes a first transistor. A first amplifier is coupled in a first feedback arrangement between the first memory cell and the first transistor. During a read operation of the first memory cell, a current through the first memory cell is substantially equal to a current through the second memory cell. The memory cell may include a magnetic tunnel junction (MTJ).

15 Claims, 7 Drawing Sheets

(56) References Cited

U.S. PATENT DOCUMENTS

| | | | |
|---|---|---|---|
| 2014/0153313 A1 | 6/2014 | Boulamaa et al. | |
| 2015/0036444 A1* | 2/2015 | Seo | G11C 7/065 |
| | | | 365/210.1 |
| 2015/0063012 A1 | 3/2015 | Jung et al. | |
| 2016/0300612 A1 | 10/2016 | Manipatruni | |
| 2017/0213584 A1 | 7/2017 | Choy | |

OTHER PUBLICATIONS

Klostermann et al, "A Perpendicular Spin Torque Switching based MRAM for the 28 nm Technology Node", IEEE International Electron Devices Meeting, Dec. 10-12, 2007, pp. 187-190.

Ohsawa et al, "A 1 Mb Nonvolatile Embedded Memory Using 4T2MTJ Cell With 32 b Fine-Grained Power Gating Scheme", IEEE Journal of Solid-Slate Circuits, Jun. 2013, pp. 1511-1520, vol. 48, No. 6.

Palermo, Sam, "ECEN720: High-Speed Links Circuits and Systems Spring 2017, Lecture 6: RX Circuits," 48 pages.

Schinkel et al, "A Double-Tail Latch-Type Voltage Sense Amplifier with 18ps Setup+Hold Time" 2007 IEEE International Solid-State Circuits Conference, Feb. 13, 2007, 3 pages.

Xu et al, "Design of Spin-Torque Transfer Magnetoresistive RAM and CAM/TCAM with High Sensing and Search Speed", IEEE Transactions on Very Large Scale Integration (VLSI) Systems, Jan. 2010, pp. 66-74.

Notice of Allowance dated Nov. 23, 2016 in related U.S. Appl. No. 15/003,922.

Notice of Allowance dated Apr. 13, 2017 in U.S. Appl. No. 15/003,922.

Notice of Allowance dated May 24, 2017 in U.S. Appl. No. 15/446,073.

Non-Final Office Action for U.S. Appl. No. 14/924,269, dated Apr. 6, 2017, 18 pages.

Notice of Allowance dated Jul. 21, 2017 for U.S. Appl. No. 15/446,073.

Notice of Allowance dated Aug. 1, 2017 for U.S. Appl. No. 14/924,269.

* cited by examiner

SENSE PATH CIRCUITRY SUITABLE FOR MAGNETIC TUNNEL JUNCTION MEMORIES

This application is a divisional application of a U.S. patent application entitled "SENSE PATH CIRCUITRY SUITABLE FOR MAGNETIC TUNNEL JUNCTION MEMORIES", having a serial number of Ser. No. 14/924,269, having a filing date of Oct. 27, 2015, having common inventors, and having a common assignee, all of which is incorporated by reference in its entirety.

BACKGROUND

Field

This disclosure relates generally to Magnetic Tunnel Junction (MTJ) memories, and more specifically, to sense path circuitry for MTJ memory sense amplifiers.

Related Art

Magnetic Tunnel Junction (MTJ) memories are being considered to rival FLASH memories and other non-volatile memories. To be commercially practical, however, MTJ memories must have comparable memory density to current memory technologies, be scalable for future generations, operate at low voltages, have low power consumption, and have competitive read/write speeds.

Storing data is accomplished by passing current into an MTJ device and causing the MTJ device to be in either a low resistance state or high resistance state. Reading data stored in the memory is accomplished by sensing differences in tunnel junction resistance in the MTJ cells between the two states. Typically, the stored state of a memory cell can be determined by comparing the cell state to that of a reference cell. However, the difference in resistance between a high state and a low state can be very small, requiring a sense amplifier with high sensitivity. Therefore, there is a need for a sense amplifier having improved sensitivity.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, the present disclosure provides memory sense circuitry for sensing a magnetic tunnel junction (MTJ) cell. A sense amplifier circuit having sense path circuitry enables relatively precise comparison of two resistor values in an array. The MTJ cell may be integrated with volatile memory such as dynamic random access memory (DRAM) or static random access memory (SRAM). The memory sense circuitry is coupled to the MTJ cell and includes a feedback amplifier, a feedback path, a sense amplifier output inverter, and a set of switches. The set of switches are configured for enabling a calibration phase and a sensing phase. During the calibration phase, the feedback amplifier is set to its quiescent point while the feedback path including bit-lines is initialized. During a sensing phase, the feedback amplifier maintains a predetermined voltage across an MTJ element of a memory cell coupled to the sense circuitry. The current through the MTJ element is compared with a reference current and amplified by the sense amplifier to generate output data. In some embodiments, the reference current may be generated with a complementary feedback circuit coupled to a reference resistor or MTJ element.

Figure 1:
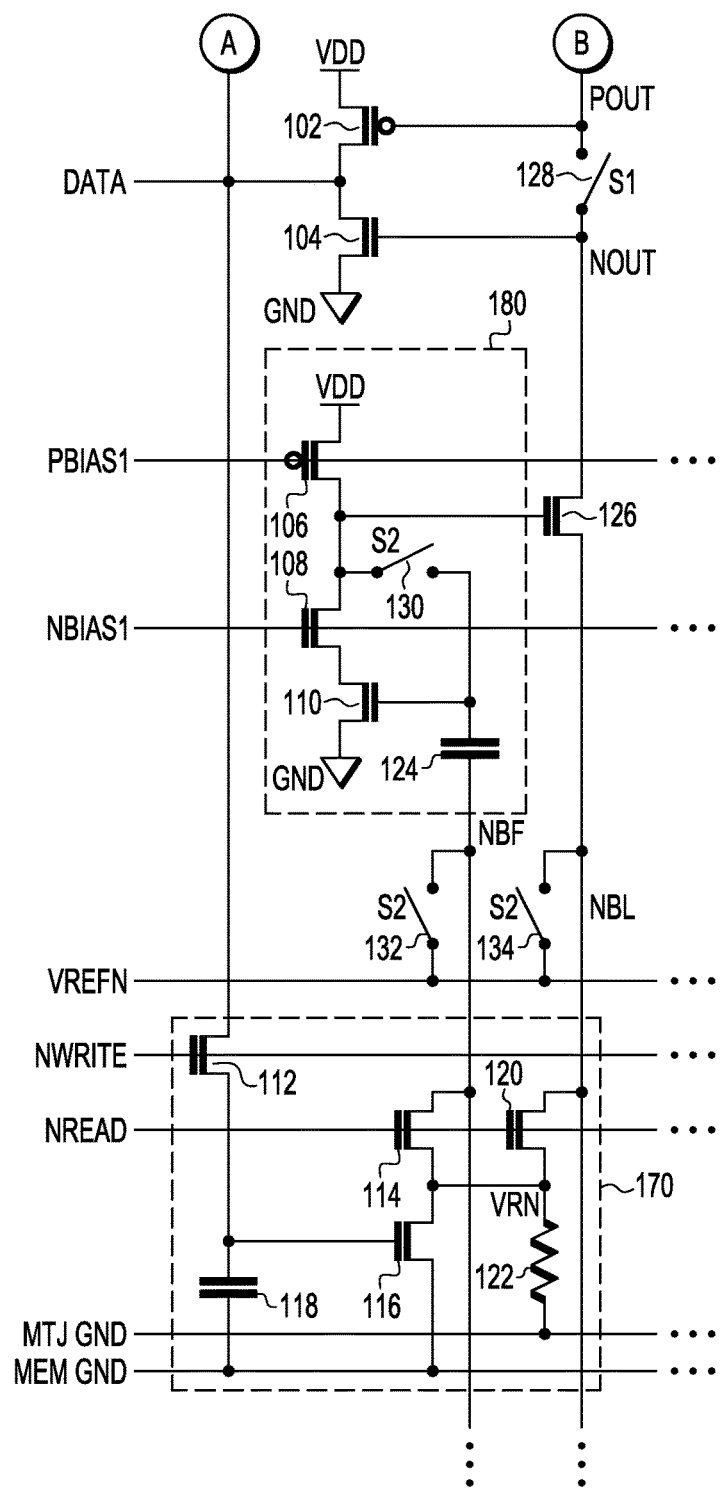
FIG. 1 shows a simplified schematic of a first portion of a Magnetic Tunnel Junction (MTJ) memory circuit according to an embodiment of the present disclosure.

FIG. 1 shows a simplified schematic of a first portion 100 of a magnetic tunnel junction (MTJ) memory circuit according to an embodiment of the present disclosure. The first portion 100 of the MTJ memory circuit includes a first bit-cell 170, a first feedback amplifier 180, a sense amplifier output inverter, a first N-channel read transistor 126 and a plurality of switches 128-134. Switch 128 is controlled by a first control signal S1 and switches 130-134 are controlled by a second control signal S2. A plurality of first bit-cells 170 maybe arranged in one or more rows and one or more columns to form a memory array of first bit-cells 170.

The first bit-cell 170 includes an MTJ memory element 122, an N-channel read transistor 120, an N-channel feedback transistor 114, an N-channel write transistor 112, a storage capacitor 118, and an N-channel control transistor 116. Transistors 112, 116, and capacitor 118 form a volatile portion of bit-cell 170 and MTJ memory element 122 forms a non-volatile portion of bit-cell 170. In this embodiment, transistor 112 and capacitor 118 form a dynamic random access memory (DRAM) cell coupled to the MTJ memory element 122 by way of transistor 116. A first current electrode of transistor 120 is coupled to a first bit-line labeled NBL and a second current electrode of transistor 120 is coupled to a first electrode of the MTJ memory element 122. A second electrode of the MTJ memory element 122 is coupled to an MTJ ground signal MTJ GND. A first current electrode of transistor 114 is coupled to a first feedback line labeled NBF providing a feedback path to the feedback amplifier 180 and a second current electrode of transistor 114 is coupled to the first electrode of the MTJ memory element 122 and to a first current electrode of transistor 116. A control electrode of transistor 120 and a control electrode of transistor 114 are each coupled to receive a first decode signal NREAD. A first current electrode of transistor 112 is coupled to a first data line DATA and a second current electrode of transistor 112 is coupled to a first terminal of capacitor 118 and to a control electrode of transistor 116. A control electrode of transistor 112 is coupled to receive a first write signal NWRITE. A second terminal of capacitor 118 and a second current electrode of transistor 116 are each coupled to a memory ground signal MEM GND.

The first feedback amplifier 180 includes a first P-channel bias transistor 106, a first N-channel bias transistor 108, a first capacitive level shifter including N-channel transistor 110 and capacitive element such as capacitor 124, and switch 130. A first current electrode of transistor 106 is coupled to a first voltage supply VDD and a second current electrode of transistor 106 is coupled to a first current electrode of transistor 108, a first terminal of switch 130, and a control electrode of read transistor 126 as an output of the first feedback amplifier 180. A control electrode of transistor 106 is coupled to receive a first bias voltage PBIAS1. A second current electrode of transistor 108 is coupled to a first current electrode of transistor 110 and a control electrode of transistor 108 is coupled to receive a second bias voltage NBIAS1. A second current electrode of transistor 110 is coupled to a second supply voltage GND and a control electrode of transistor 110 is coupled to a second terminal of switch 130 and a first terminal of capacitor 124. A first current electrode of read transistor 126 is coupled to the first bit-line NBL, and a second terminal of capacitor 124 is coupled to the first feedback line NBF as an input to the first feedback amplifier 180.

The sense amplifier output inverter of the first portion of the MTJ memory circuit 100 includes P-channel transistor 102 and N-channel transistor 104. A first current electrode of transistor 102 is coupled to the first voltage supply VDD and a second current electrode of transistor 102 is coupled to the first data line DATA and to a first current electrode of transistor 104. A second current electrode of transistor 104 is coupled to the second supply voltage GND. A control electrode of transistor 104 is coupled to a second current electrode of transistor 126 and a first terminal of switch 128 at node labeled NOUT. The second current electrode of transistor 126 receives a reference current during a read operation of first bit-cell 170. A control electrode of transistor 102 is coupled to a second terminal of switch 128 at node labeled POUT and to a first current electrode of a second P-channel read transistor 160 (shown in FIG. 2).

A first terminal of switch 132 is coupled to the first feedback line NBF and a first terminal of switch 134 is coupled to the first bit-line NBL. A second terminal of switch 132 and a second terminal of switch 134 are each coupled to a first reference voltage VREFN.

Figure 2:
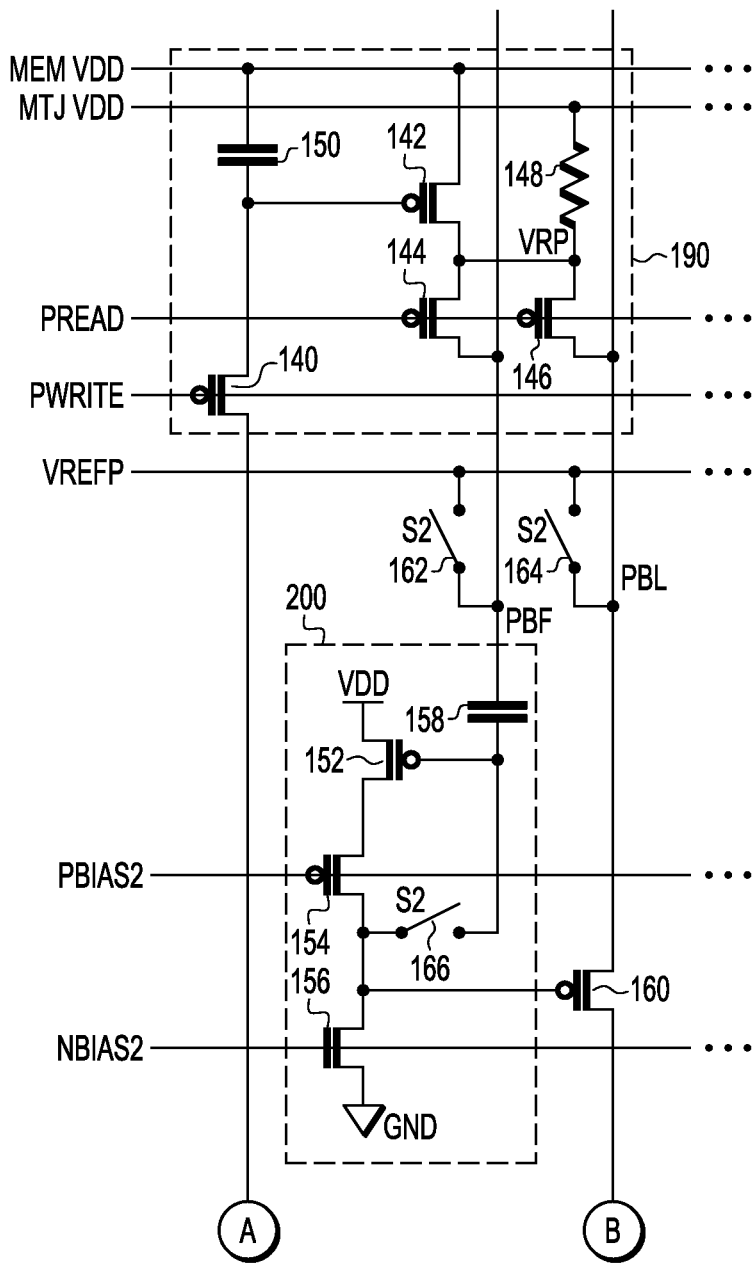
FIG. 2 shows a simplified schematic of a second portion of the MTJ memory circuit according to an embodiment of the present disclosure.

FIG. 2 shows a simplified schematic of a second portion 100' of the MTJ memory circuit according to an embodiment of the present disclosure. The first portion 100 and the second portion 100' of the MTJ memory circuit connect via connection points A and B to form the MTJ memory circuit. The second portion 100' of the MTJ memory circuit includes a second bit-cell 190, a second feedback amplifier 200, the second P-channel read transistor 160 and a plurality of switches 162-166. Switches 162-166 are controlled by the second control signal S2. A plurality of second bit-cells 190 maybe arranged in one or more rows and one or more columns to form a memory array of second bit-cells 190.

The second bit-cell 190 includes an MTJ memory element 148, a P-channel read transistor 146, a P-channel feedback transistor 144, a P-channel write transistor 140, a storage capacitor 150, and a P-channel control transistor 142. Transistors 140, 142, and capacitor 150 form a volatile portion of second bit-cell 190 and MTJ memory element 148 forms a non-volatile portion of second bit-cell 190. A first current electrode of transistor 146 is coupled to a second bit-line PBL and a second current electrode of transistor 146 is coupled to a first electrode of the MTJ memory element 148.

A second electrode of the MTJ memory element 148 is coupled to an MTJ supply signal labeled MTJ VDD. A first current electrode of transistor 144 is coupled to a second feedback line PBF and a second current electrode of transistor 144 is coupled to the first electrode of the MTJ memory element 148 and to a first current electrode of transistor 142. A control electrode of transistor 146 and a control electrode of transistor 144 are each coupled to receive a second decode signal PREAD. A first current electrode of transistor 140 is coupled to the first data line DATA and a second current electrode of transistor 140 is coupled to a first terminal of capacitor 150 and to a control electrode of transistor 142. A control electrode of transistor 140 is coupled to receive a second write signal PWRITE. A second terminal of capacitor 150 and a second current electrode of transistor 142 are each coupled to a memory supply signal labeled MEM VDD. A selectable current path is formed with switch 128 and transistors 126 and 160, and is coupled between the first bit-cell 170 and the second bit-cell 190.

The second feedback amplifier 200 includes a second P-channel bias transistor 154, a second N-channel bias transistor 156, a second capacitive level shifter including P-channel transistor 152 and capacitor 158, and switch 166. A first current electrode of transistor 156 is coupled to the second voltage supply GND and a second current electrode of transistor 156 is coupled to a control electrode of read transistor 160, a first current electrode of transistor 154, and a first terminal of switch 166. A control electrode of transistor 156 is coupled to receive a third bias voltage NBIAS2. A second current electrode of transistor 154 is coupled to a first current electrode of transistor 152 and a control electrode of transistor 154 is coupled to receive a second bias voltage PBIAS2. A second current electrode of transistor 152 is coupled to the first supply voltage VDD and a control electrode of transistor 152 is coupled to a second terminal of switch 166 and a first terminal of capacitor 158. A second current electrode of read transistor 160 is coupled to the second bit-line PBL and a second terminal of capacitor 158 is coupled to the second feedback line PBF.

A first terminal of switch 162 is coupled to the second feedback line PBF and a first terminal of switch 164 is coupled to the second bit-line PBL. A second terminal of switch 162 and a second terminal of switch 164 are each coupled to a second reference voltage VREFP.

Figure 3:
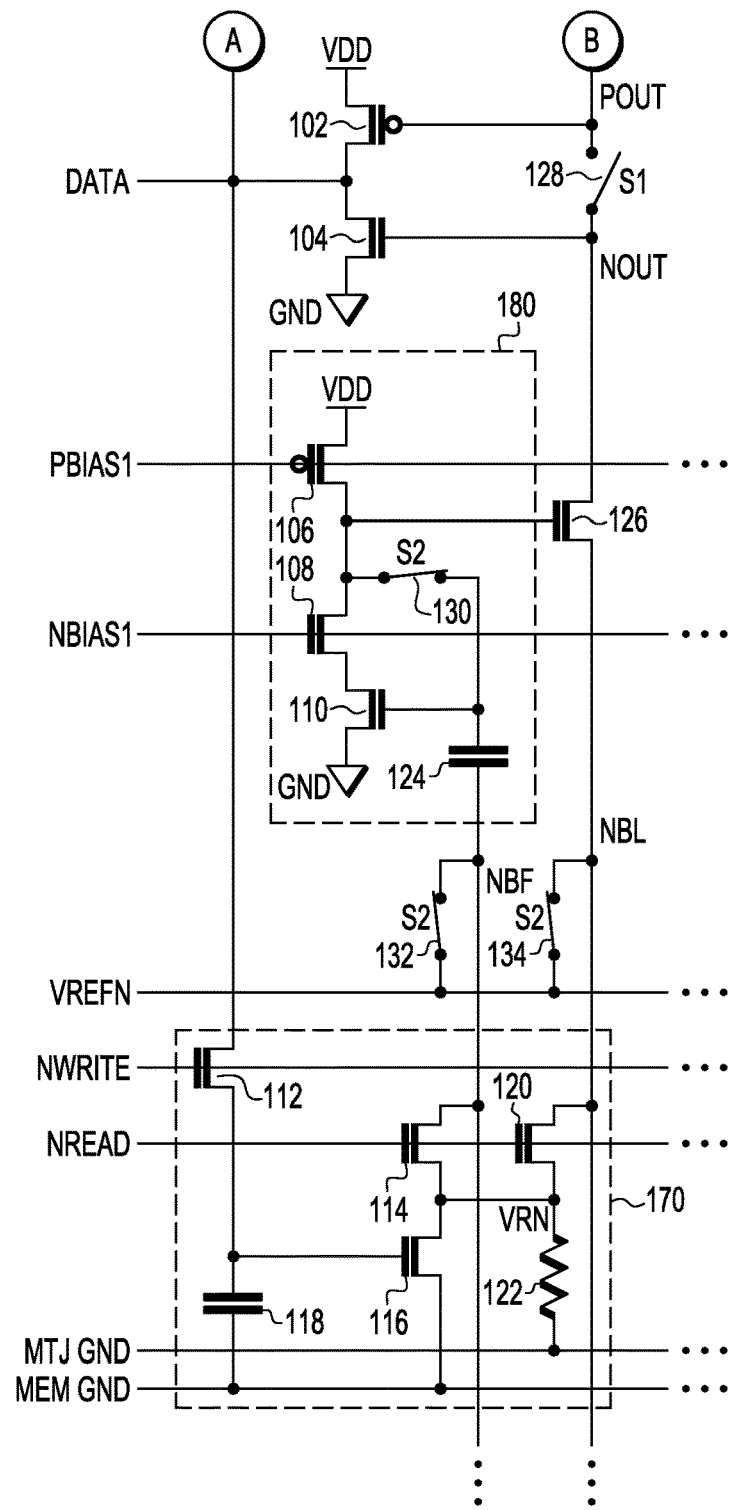
FIG. 3 shows a simplified schematic of the first portion of the MTJ memory circuit during a calibration phase according to an embodiment of the present disclosure.

FIG. 3 shows a simplified schematic of the first portion 100 of the MTJ memory circuit with switches configured for an exemplary calibration phase according to an embodiment of the present disclosure. For the switch configuration during the calibration phase of the MTJ memory operation, switches 130, 132, and 134 are closed or conducting and switch 128 is opened or non-conducting. During the calibration phase, the MTJ GND and MEM GND signals are driven to approximately ground or zero volts, and VREFN reference voltage is set to bias the MTJ memory element 122 at an appropriate read voltage without disturbing stored information in the element. For example, the VREFN reference voltage may be set to a value whereby the voltage across the MTJ memory element 122 is in a range of 50-100 mV. NOUT, NBL, and NBF are pre-charged to the VREFN voltage in preparation for the sensing phase.

Figure 4:
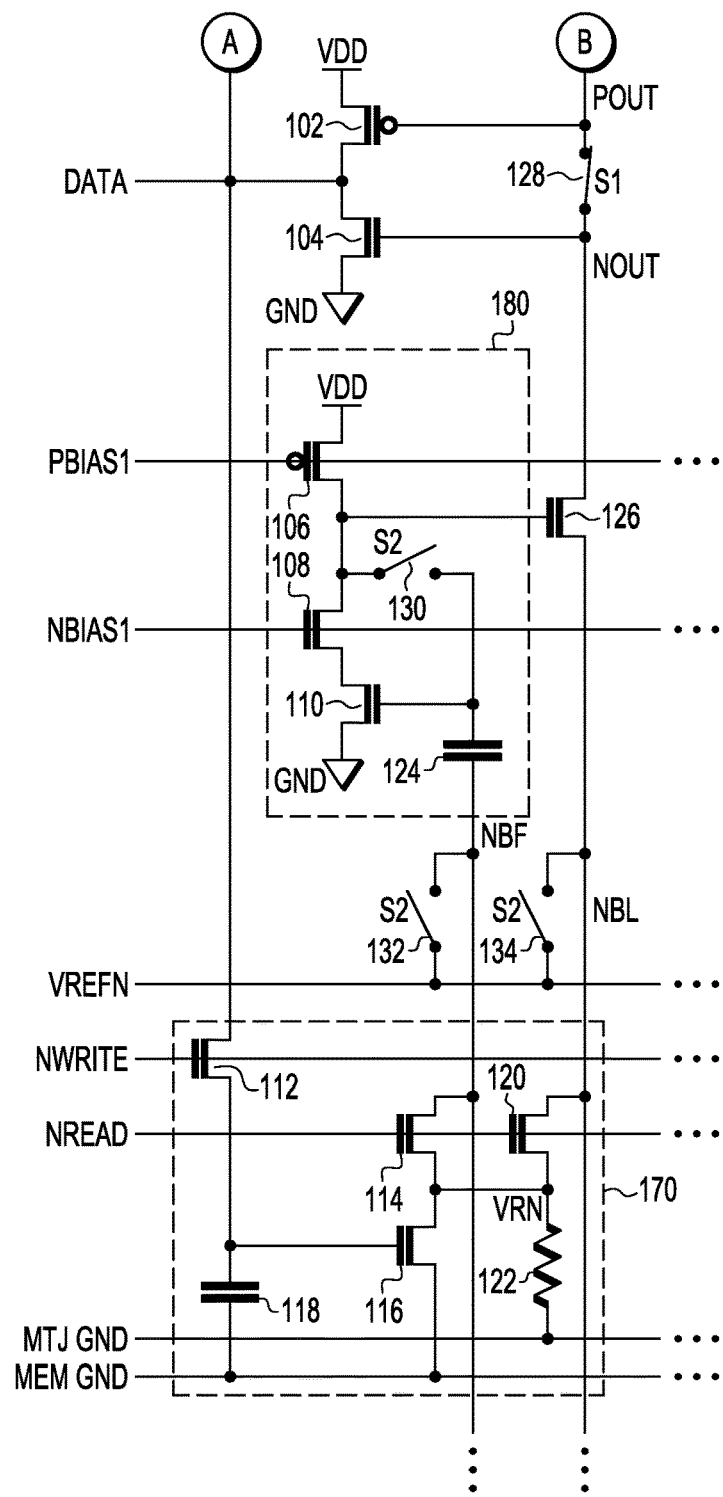
FIG. 4 shows a simplified schematic of the first portion of the MTJ memory circuit during a sensing phase according to an embodiment of the present disclosure.

FIG. 4 shows a simplified schematic of the first portion 100 of the MTJ memory circuit with switches configured for a sensing phase of a read operation according to an embodiment of the present disclosure. For the switch configuration during the sensing phase of the MTJ memory operation, switches 130, 132, and 134 are opened or non-conducting and switch 128 is closed or conducting. During the sensing phase, the MTJ GND signal is driven to approximately ground or zero volts and MEM GND signal is biased or allowed to float to a voltage approximately equal to the voltage applied to the MTJ memory element 122 at node VRN. When switches 130-134 open and switch 128 closes, POUT and NOUT nodes are pulled together to a voltage approximately midway between VDD and GND for example. When the NREAD signal asserts as a logic high, data stored in the bit-cell 170 is coupled onto the bit-line NBL and a sense path is enabled coupling the bit-cell with the first feedback line NBF. The first feedback amplifier 180 forms a feedback path from the output through transistor 126, 120, and 114, and back to the input. The first feedback amplifier 180 along with the feedback path maintains a constant voltage across the MTJ element 122 to improve the sensitivity when reading a stored value on the MTJ element 122. In some embodiments, the voltage maintained across the MTJ element 122 is in the range of 50-100 millivolts (mV). By simultaneously coupling the bit-cell to bit-line NBL and to the feedback line NBF, impedances in the sensing path are effectively reduced. The difference between current passing through MTJ memory element 122 and a corresponding reference current generates a change in the bias voltages of nodes POUT and NOUT which is amplified by the sense amplifier output inverter and output onto the first data line DATA. In some embodiments, the MTJ memory element 148 functions as a reference for the sensing phase of the read operation of the MTJ memory element 122. In some embodiments, during the sensing phase of the read operation, current through the MTJ memory element 122 may be substantially equal to current through the MTJ memory element 148.

Figure 5:
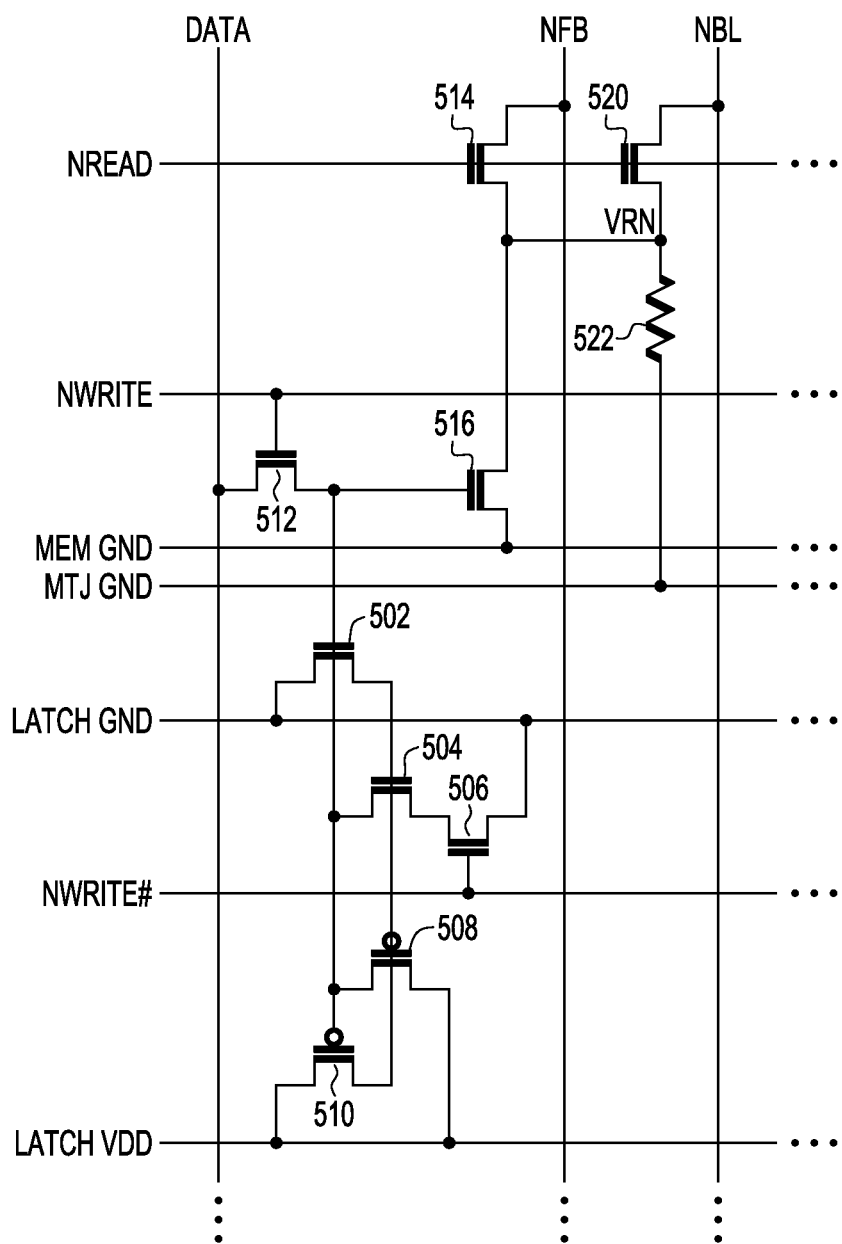
FIG. 5 shows a simplified schematic of another bit-cell for the MTJ memory circuit of FIGS. 1 and 2 according to an embodiment of the present disclosure.

FIG. 5 shows a simplified schematic of another bit-cell 500 for the MTJ memory circuit of FIG. 1 according to an embodiment of the present disclosure. The bit-cell 500 may be used as at least one alternative to bit-cell 170 of FIG. 1. A plurality of bit-cells 500 maybe arranged in one or more rows and one or more columns to form a memory array of bit-cells 500. The bit-cell 500 includes a non-volatile portion and a volatile portion, an N-channel read transistor 520, an N-channel feedback transistor 514, an N-channel write transistor 512, and an N-channel control transistor 516. Transistors 502-510 configured as a static random access memory (SRAM) cell form a volatile portion of bit-cell 500. The MTJ memory element 522 forms the non-volatile portion of bit-cell 500 and is coupled to the volatile portion of bit-cell 500.

A first current electrode of transistor 520 is coupled to the first bit-line NBL and a second current electrode of transistor 520 is coupled to a first electrode of the MTJ memory element 522. A second electrode of the MTJ memory element 522 is coupled to the MTJ ground signal MTJ GND. A first current electrode of transistor 514 is coupled to the first feedback line NBF and a second current electrode of transistor 514 is coupled to the first electrode of the MTJ memory element 522 and to a first current electrode of transistor 516. A control electrode of transistor 520 and a control electrode of transistor 514 are each coupled to receive the first decode signal NREAD. A first current electrode of transistor 512 is coupled to the first data line DATA, and a second current electrode of transistor 512 is coupled to a control electrode of transistor 516 and to receive an signal at an output of the SRAM volatile portion. A control electrode of transistor 512 is coupled to receive the first write signal NWRITE.

The SRAM volatile portion of the bit-cell 500 includes N-channel transistors 502-506 and P-channel transistors 508-510. A control electrode of transistor 502, a first current electrode of transistor 504, a first current electrode of transistor 508, and a control electrode of transistor 510 are each coupled to the output of the SRAM volatile portion. A first current electrode of transistor 502, a control electrode of transistor 504, a control electrode of transistor 508, and a first current electrode of transistor 510 are coupled to each other. A second current electrode of transistor 510 and a second current electrode of transistor 508 are each coupled to receive a supply signal LATCH VDD. A second electrode of transistor 502 and a first current electrode of transistor 506 are each coupled to receive a ground signal LATCH GND. A second current electrode of transistor 506 is coupled to a second current electrode of transistor 504, and a control electrode of transistor 506 is coupled to receive a write signal NWRITE#. NWRITE# is a complement signal of the NWRITE signal.

Figure 6:
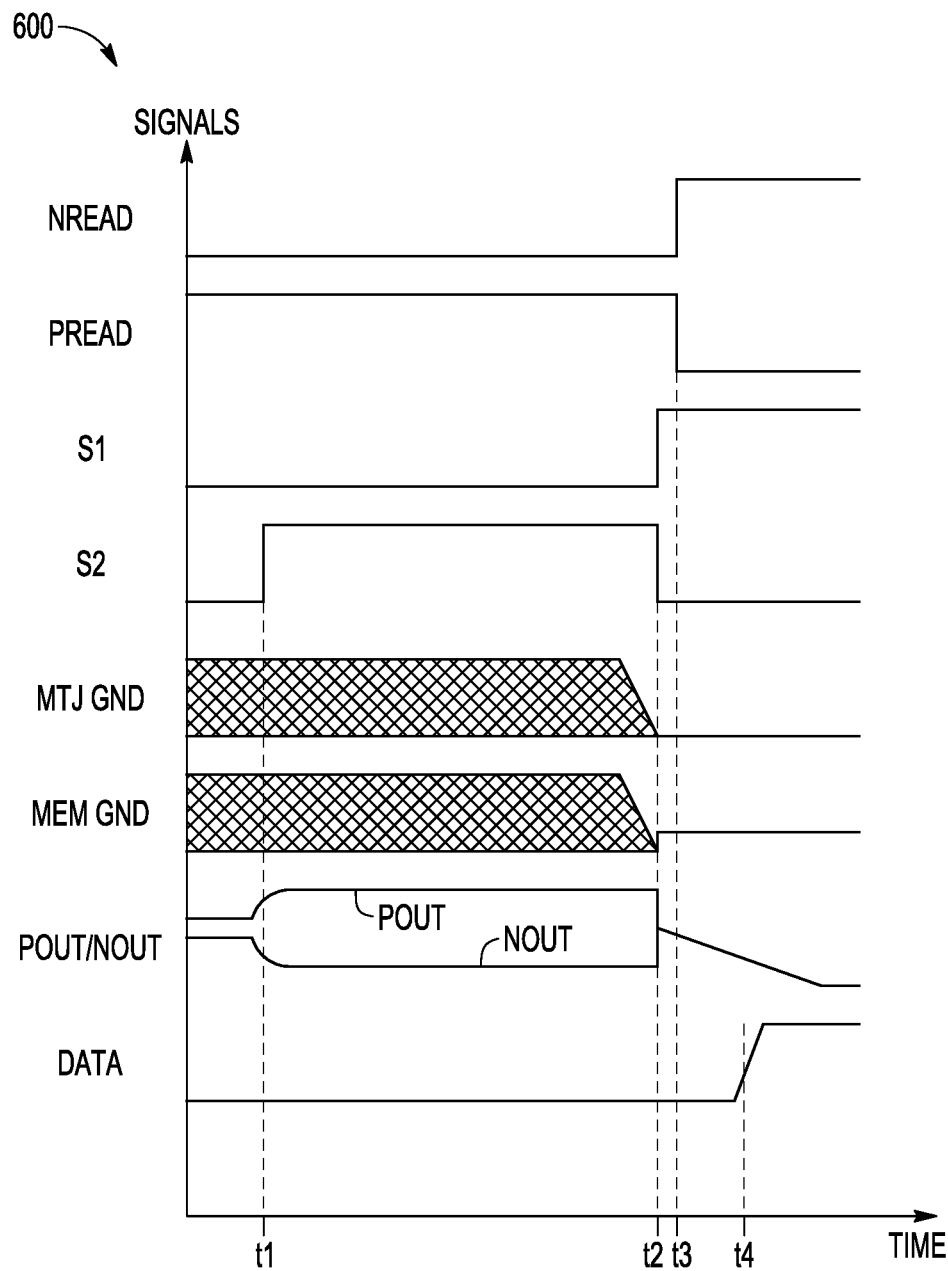
FIG. 6 shows a simplified timing diagram of various signals during a read operation of the MTJ memory circuit of FIGS. 1 and 2 according to an embodiment of the present disclosure.

FIG. 6 shows a simplified timing diagram of various signals during an exemplary read operation of the MTJ memory circuit of FIGS. 1 and 2 according to an embodiment of the present disclosure. By way of example, at time t1, switch control signal S1 is de-asserted as a logic low and switch control signal S2 is asserted as a logic high causing the MTJ memory circuit to be in a calibration phase of a read operation. In the calibration phase, MTJ GND and MEM GND signals are isolated from sense amplifier circuitry while NREAD is de-asserted as a logic low. While control signal S2 is asserted, switches 134 and 164 are closed causing the POUT input to the sense amplifier output inverter to be driven to VREFP and the NOUT input to the sense amplifier output inverter to be driven to VREFN. In this example, the sense amplifier output inverter is in a high impedance state and does not drive the DATA line. In some embodiments, the DATA line may be driven low from outside of the sense amplifier circuitry to disable transistor 116 so that the leakage current between MEM GND and MEM GND signals may be reduced. At time t2 switch control signal S1 is asserted as a logic high, switch control signal S2 is de-asserted as a logic low level, the MTJ GND signal provides a voltage of approximately ground or zero volts to bit-cell 170, the MEM GND signal provides a voltage approximately equal to VREFN to bit-cell 170, and POUT and NOUT nodes are pulled together to a voltage approximately midway between VDD and GND. At time t3, the NREAD signal is asserted as a logic high and the PREAD signal is asserted as a logic low allowing stored information in bit-cell 170 to transfer onto bit line NBL and onto the NOUT and POUT inputs to the sense amplifier output inverter. In this example, a voltage level representative of a stored logic low is sensed causing the output of the sense amplifier output inverter to transition to a logic high at time t4.

Figure 7:
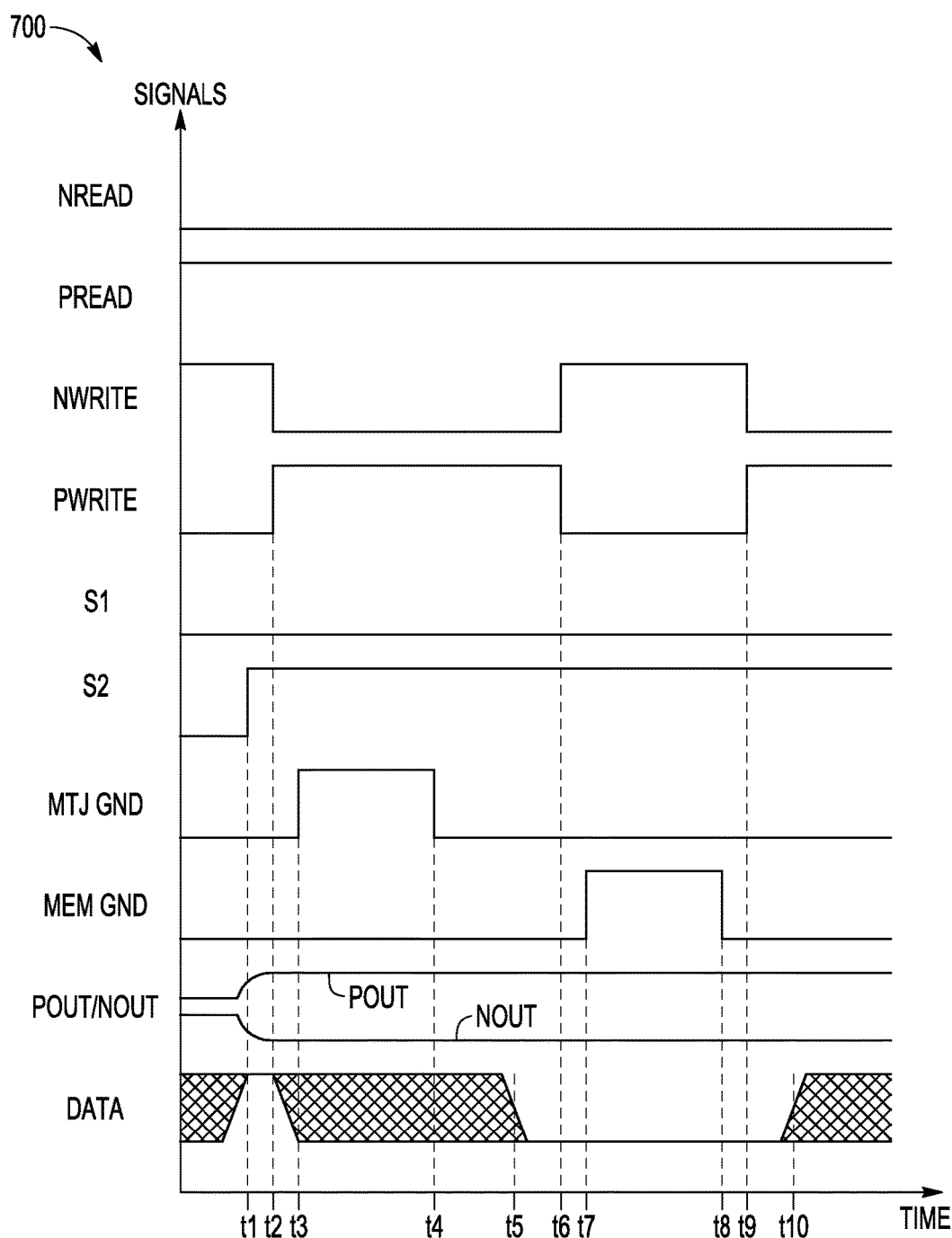
FIG. 7 shows a simplified timing diagram of various signals during a write operation of the MTJ memory circuit of FIGS. 1 and 2 according to an embodiment of the present disclosure.

FIG. 7 shows a simplified timing diagram of various signals during an exemplary write operation of the MTJ memory circuit of FIGS. 1 and 2 according to an embodiment of the present disclosure. During the write operation, the NREAD and PREAD signals are asserted to logic low and high, respectively, to isolate memory cells 170 and 190 from lines NBL, NBF, PBL, and PBF. Likewise, switch control signal S2 is asserted to a logic high and switch control signal S1 is de-asserted to a logic low configuring the sense amplifier circuitry for the calibration phase, POUT and NOUT are driven to VREFP and VREFN respectively.

By way of example, at time t1, the DATA line is driven from outside of the sense amplifier circuitry to a logic high while NWRITE and PWRITE are asserted to logic high and logic low, respectively. A corresponding value from the logic high on the DATA line is stored on capacitors 118 and 115, enabling conduction through transistor 116 while disabling conduction through transistor 144. A current path between MTJ GND and MEM GND through MTJ memory element 122 is then enabled, while a current path between MTJ VDD and MEM VDD through MTJ memory element 148 is disabled. At time t2, NWRITE and PWRITE are de-asserted to logic low and logic high, respectively. At t2, the DATA line may be driven from outside of the sense amplifier circuitry to a next logic value. In this example, MTJ memory element 122 is written during time t3 to t4 by applying a positive bias voltage approximately equal to VDD on the MTJ GND signal while MEM GND is approximately at ground or 0 volts. A stored state of MTJ memory element 122 will be determined by the direction of current flow though the element, for example to a stored low resistance state. During time t5 to t10, the DATA line is driven from outside of the sense amplifier circuitry to a logic low while NWRITE and PWRITE are asserted to logic high and low, respectively. A corresponding value from the logic low on the DATA line is stored on capacitors 118 and 115, disabling conduction through transistor 116 while enabling conduction through transistor 144. During time t7 to t8, a positive bias voltage approximately equal to VDD is applied on the MEM GND signal. Because transistor 116 is turned off, no current flows through MTJ memory element 122, and therefore the MTJ memory element 122 maintains its programmed state, for example a low resistance state.

Alternatively, if the DATA line is driven from outside of the sense amplifier circuitry to a logic low during time t1 to t2, and driven high during time t5 to t10, then current would flow through the MTJ memory element 122 in a direction during time t7 to t8 opposite to a current direction corresponding with time t3 to t4 according to the example in FIG. 7, thus writing the MTJ memory element to an opposite state, for example a high resistance state. Likewise, MTJ memory element 148 may be programmed similarly according to the example described above, by causing a direction of current flow though the element, for example programming the element to a low resistance or high resistance state.

Generally, there is provided, a memory including: a first memory element; a first read transistor having a first current electrode coupled to receive a reference current during a read operation of the memory, a second current electrode coupled to the first memory element, and a control electrode; and a first feedback transistor having a first current electrode coupled to provide a feedback path to the control electrode of the first read transistor, a second current electrode coupled to the first memory element, and a control electrode for receiving a first decode signal. The first memory element may include a magnetic tunnel junction (MTJ). The memory may further include a volatile memory cell portion coupled to the first memory element, the volatile memory cell portion may include one of a static random access memory cell or a dynamic random access memory cell. The memory may further include a first feedback amplifier having an input terminal coupled to the first current electrode of the first feedback transistor, and an output terminal coupled to the control electrode of the first read transistor. The memory may further comprising: a second memory element; a second read transistor having a first current electrode coupled to the second memory element, a second current electrode for providing the reference current to the first current electrode of the first read transistor, and a control electrode; a second feedback transistor having a first current electrode coupled to the second memory element, a second current electrode, and a control electrode for receiving a second decode signal; and a second feedback amplifier having an input terminal coupled to the second current electrode of the second feedback transistor, and an output terminal coupled to the control electrode of the second read transistor. The second memory element may include a magnetic tunnel junction (MTJ). During the read operation, a current through the first memory element may be substantially equal to a current through the second memory element. The memory may further include a level shifter coupled between the first feedback transistor and the input terminal of the first feedback amplifier. The memory may further include a capacitive element for voltage level shifting a feedback signal from the first feedback transistor to the input of the first feedback amplifier.

In another embodiment, there is provided, a memory including: a first memory cell; a second memory cell; a selectable current path, coupled between the first memory cell and the second memory cell, comprising a first transistor; and a first amplifier coupled in a first feedback arrangement between the first memory cell and the first transistor, wherein during a read operation of the first memory cell, a current through the first memory cell is substantially equal to a current through the second memory cell. The selectable current path may further include a second transistor in series with the first transistor, and the memory may further include a second amplifier coupled in a second feedback arrangement between the second memory cell and the second transistor. The first memory cell may include a magnetic tunnel junction (MTJ) and the second memory cell may functions as a reference for the read operation of the first memory cell. The memory may further include a capacitive level shifter coupled between the first memory cell and an input of the first amplifier. The first memory cell and the second memory cell each may include a volatile memory element portion and a non-volatile memory element portion, wherein the read operation may be to the non-volatile memory element portion of the first memory cell. The volatile memory element portion may include one of a dynamic random access memory cell or a static random access memory cell. The first memory cell may be part of a first array of memory cells and the second memory cell may be part of a second array of memory cells.

In yet another embodiment, there is provided, a memory including a plurality of memory cells, the memory including: a first memory cell coupled to a first bit line; a first transistor having a first current electrode coupled to the first bit line, a second current electrode, and a control electrode; a first feedback transistor having a first current electrode coupled to the first memory cell, a second current electrode, and a control electrode for receiving a first decode signal; a first feedback amplifier having an input terminal coupled to the second current electrode of the first feedback transistor, and an output terminal coupled to the control electrode of the first transistor; a second memory cell coupled to a second bit line; a second transistor having a first current electrode coupled to the second memory cell, a second current electrode, and a control electrode; a second feedback transistor having a first current electrode coupled to the second memory cell, a second current electrode, and a control electrode for receiving a second decode signal; and a second feedback amplifier having an input terminal coupled to the second current electrode of the second feedback transistor, and an output terminal coupled to the control electrode of the second transistor. The first memory cell and the first transistor may include N-channel transistors, and the second memory cell and the second transistor may include P-channel transistors. The memory may further include an input/output circuit coupled to the second current electrode of the first transistor and to the second current electrode of the second transistor. The first memory cell and the second memory cell each may include a volatile memory element portion and a magnetic tunnel junction (MTJ) portion, wherein the read operation may be to the non-volatile memory element portion of the first memory cell.

By now it should be appreciated that there has been provided memory sense circuitry for sensing a magnetic tunnel junction (MTJ) cell including a sense amplifier having sense path circuitry that enables relatively precise comparison of two resistor values in an array.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Those skilled in the art will recognize that boundaries between the functionality of the above described phases and operations are merely illustrative. The functionality of multiple phases may be combined into a single operation, and/or the functionality of a single operation may be distributed in multiple phases. Alternative embodiments may include multiple instances of a particular phase or operation, and the order of phases or operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory comprising:
   a first memory cell;
   a second memory cell;
   a selectable current path, coupled between the first memory cell and the second memory cell, comprising a first transistor; and
   a first amplifier coupled in a first feedback arrangement between the first memory cell and the first transistor, an output of the first amplifier directly connected to a control electrode of the first transistor,
   wherein during a read operation of the first memory cell, a current through the first memory cell is substantially equal to a current through the second memory cell.

2. The memory of claim 1, wherein the selectable current path further comprises a second transistor in series with the first transistor, and wherein the memory further comprises a second amplifier coupled in a second feedback arrangement between the second memory cell and the second transistor.

3. The memory of claim 1, wherein the first memory cell comprises a magnetic tunnel junction (MTJ) and the second memory cell functions as a reference for the read operation of the first memory cell.

4. The memory of claim 1, further comprising a capacitive level shifter coupled between the first memory cell and an input of the first amplifier.

5. The memory of claim 1, wherein the first memory cell and the second memory cell each comprises a volatile memory element portion and a non-volatile memory element portion, wherein the read operation is to the non-volatile memory element portion of the first memory cell.

6. The memory of claim 5, wherein the volatile memory element portion comprises one of a dynamic random access memory cell or a static random access memory cell.

7. The memory of claim 5, wherein the first memory cell is part of a first array of memory cells and the second memory cell is part of a second array of memory cells.

8. A memory comprising:
a first memory cell;
a second memory cell;
a selectable current path, coupled between the first memory cell and the second memory cell, comprising a first transistor and a second transistor coupled in series;
a first amplifier coupled in a first feedback arrangement between the first memory cell and the first transistor, an output of the first amplifier directly connected to a control electrode of the first transistor; and
a second amplifier coupled in a second feedback arrangement between the second memory cell and the second transistor, the second amplifier different from the first amplifier, an output of the second amplifier directly connected to a control electrode of the second transistor.

9. The memory of claim 8, wherein the first memory cell comprises a magnetic tunnel junction (MTJ) and the second memory cell functions as a reference for the read operation of the first memory cell.

10. The memory of claim 8, further comprising a capacitive level shifter coupled between the first memory cell and an input of the first amplifier.

11. The memory of claim 8, wherein the first memory cell and the second memory cell each comprises a volatile memory element portion and a non-volatile memory element portion.

12. The memory of claim 11, wherein the volatile memory element portion comprises one of a dynamic random access memory cell or a static random access memory cell.

13. The memory of claim 11, wherein the first memory cell is part of a first array of memory cells and the second memory cell is part of a second array of memory cells.

14. The memory of claim 11, wherein during a read operation of the first memory cell, the memory is configured to have a current through the first memory cell substantially equal to a current through the second memory cell.

15. The memory of claim 14, wherein the read operation is to the non-volatile memory element portion of the first memory cell.

* * * * *